(12) United States Patent
Keller et al.

(10) Patent No.: US 9,012,937 B2
(45) Date of Patent: Apr. 21, 2015

(54) MULTIPLE CONVERSION MATERIAL LIGHT EMITTING DIODE PACKAGE AND METHOD OF FABRICATING SAME

(75) Inventors: Bernd Keller, Santa Barbara, CA (US); James Ibbetson, Santa Barbara, CA (US)

(73) Assignee: Cree, Inc., Goleta, CA (US)

( * ) Notice: Subject to any disclaimer, the term of this patent is extended or adjusted under 35 U.S.C. 154(b) by 0 days.

(21) Appl. No.: 11/974,431

(22) Filed: Oct. 10, 2007

(65) Prior Publication Data

US 2009/0095966 A1   Apr. 16, 2009

(51) Int. Cl.
*H01L 33/00* (2010.01)
*C09K 11/77* (2006.01)
*H01L 33/50* (2010.01)

(52) U.S. Cl.
CPC .......... *C09K 11/7734* (2013.01); *H01L 33/504* (2013.01); *H01L 2924/0002* (2013.01)

(58) Field of Classification Search
USPC ......... 313/487, 504; 362/231; 257/99, 98, 89, 257/100, E25.02
See application file for complete search history.

(56) References Cited

U.S. PATENT DOCUMENTS

| | | |
|---|---|---|
| 3,896,479 A | 7/1975 | Di Lorenzo |
| 4,152,044 A | 5/1979 | Liu |
| 4,675,575 A | 6/1987 | Smith et al. |
| 4,914,489 A | 4/1990 | Awano ............................. 257/6 |
| 4,946,547 A | 8/1990 | Palmour et al. ................ 156/643 |
| 4,963,948 A | 10/1990 | Awano .......................... 257/183 |
| 5,034,783 A | 7/1991 | Chang et al. .................... 257/14 |
| 5,200,022 A | 4/1993 | Kong et al. .................... 156/612 |

(Continued)

FOREIGN PATENT DOCUMENTS

| | | |
|---|---|---|
| EP | 1063711 A1 | 12/1920 |
| EP | 0 272 985 A2 | 6/1988 |

(Continued)

OTHER PUBLICATIONS

Notice Requesting Submission of Opinion re related Korean Application No. 10-2004-7001033, dated: Mar. 9, 2009.

(Continued)

*Primary Examiner* — Dale E Page
(74) *Attorney, Agent, or Firm* — Koppel, Patrick, Heybl & Philpott

(57) ABSTRACT

An emitter package comprising a light emitting diode (LED) emitting light at a wavelength within a wavelength range and a plurality of phosphors. Each of the phosphors absorbs at least some light from the LED and re-emits a different wavelength of light. The package emits a combination of light from the LED and the plurality of phosphors, with the phosphors having excitation characteristics such that the emitter package emits light within a standard deviation of a target color for LEDs emitting at the wavelengths with the wavelength range. A method for fabricating emitter packages comprising fabricating a plurality of LEDs, each of which emits at a wavelength within a range of wavelengths. Each of the LEDs are arranged in a respective package with a plurality of conversion materials so that at least some light from each of the LEDs is absorbed and re-emitted by its corresponding conversion materials. The plurality of conversion materials have excitation characteristics that compensate for different LED emission wavelengths within the LED range of wavelengths such that each of the LED packages emits light within a standard deviation from a target color.

20 Claims, 9 Drawing Sheets

| | Blue Wavelength/nm | | |
|---|---|---|---|
| | 440 | 450 | 460 |
| Blue Emitter Intensity | 1 | 1 | 1 |
| 560nm Phosphor Intensity | 0.287 | 0.190 | 0.0 |
| 570nm Phosphor Intensity | 0.301 | 0.422 | 0.546 |

| | Blue Wavelength/nm | | |
|---|---|---|---|
| | 440 | 450 | 460 |
| LED Package ccx | 0.3249 | 0.325 | 0.3249 |
| LED Package ccy | 0.3343 | 0.3344 | 0.3347 |
| LED Package CCT | 5853 | 5850 | 5853 |

(56) References Cited

U.S. PATENT DOCUMENTS

| | | | |
|---|---|---|---|
| RE34,861 E | 2/1995 | Davis et al. | 437/100 |
| 5,477,436 A | 12/1995 | Bertling et al. | |
| 5,612,567 A | 3/1997 | Baliga | |
| 5,705,321 A | 1/1998 | Brueck et al. | 430/316 |
| 5,959,316 A | 9/1999 | Lowery | 257/98 |
| 6,046,464 A | 4/2000 | Schetzina | 257/96 |
| 6,150,672 A | 11/2000 | Kaneko | 257/94 |
| 6,172,382 B1 | 1/2001 | Nagahama et al. | 257/94 |
| 6,330,111 B1 | 12/2001 | Myers | |
| 6,331,915 B1 | 12/2001 | Myers | |
| 6,331,944 B1 | 12/2001 | Monsma et al. | 365/171 |
| 6,372,536 B1 | 4/2002 | Fischer et al. | 438/46 |
| 6,389,051 B1 | 5/2002 | Van de Walle et al. | 372/45.01 |
| 6,482,711 B1 | 11/2002 | Nguyen et al. | 438/317 |
| 6,504,179 B1* | 1/2003 | Ellens et al. | 257/88 |
| 6,515,313 B1 | 2/2003 | Ibbetson et al. | 257/103 |
| 6,521,915 B2* | 2/2003 | Odaki et al. | 257/98 |
| 6,526,082 B1 | 2/2003 | Corzine et al. | 372/46.01 |
| 6,611,003 B1 | 8/2003 | Hatakoshi et al. | 257/98 |
| 6,657,393 B2 | 12/2003 | Natsume | |
| 6,693,357 B1 | 2/2004 | Borst et al. | 257/773 |
| 6,746,889 B1 | 6/2004 | Eliashevich et al. | |
| 6,765,242 B1 | 7/2004 | Chang et al. | 257/197 |
| 6,784,463 B2 | 8/2004 | Camras et al. | |
| 6,878,975 B2 | 4/2005 | Hueschen | 257/104 |
| 6,882,051 B2 | 4/2005 | Majumdar et al. | 257/746 |
| 6,932,497 B1 | 8/2005 | Huang | |
| 6,943,381 B2 | 9/2005 | Gardner et al. | 257/103 |
| 6,949,774 B2 | 9/2005 | Parikh et al. | 257/104 |
| 7,083,490 B2 | 8/2006 | Mueller et al. | 445/24 |
| 7,087,936 B2 | 8/2006 | Negley | |
| 7,491,626 B2 | 2/2009 | Gaska et al. | 438/483 |
| 2002/0015013 A1 | 2/2002 | Ragle | |
| 2002/0054495 A1 | 5/2002 | Natsume | |
| 2002/0195619 A1 | 12/2002 | Makimoto et al. | 257/197 |
| 2003/0015708 A1 | 1/2003 | Parikh | |
| 2003/0218183 A1 | 11/2003 | Micovic et al. | 257/192 |
| 2004/0057482 A1 | 3/2004 | Wang | 372/45 |
| 2004/0206966 A1 | 10/2004 | Sugawara et al. | 257/85 |
| 2004/0207313 A1 | 10/2004 | Omoto et al. | |
| 2004/0261692 A1 | 12/2004 | Dwilinski et al. | 117/84 |
| 2004/0262576 A1* | 12/2004 | Thompson et al. | 252/301.16 |
| 2005/0030995 A1 | 2/2005 | Kawakami et al. | 372/43 |
| 2005/0048766 A1 | 3/2005 | Wu et al. | 438/629 |
| 2005/0077535 A1 | 4/2005 | Li | |
| 2005/0117320 A1 | 6/2005 | Leu et al. | 362/31 |
| 2005/0152127 A1 | 7/2005 | Kamiya et al. | |
| 2005/0173692 A1 | 8/2005 | Park | |
| 2005/0213625 A1 | 9/2005 | Horie | 372/44 |
| 2005/0224829 A1 | 10/2005 | Negley et al. | 257/99 |
| 2006/0081862 A1 | 4/2006 | Chua et al. | |
| 2006/0158899 A1 | 7/2006 | Avabe et al. | |
| 2006/0220046 A1 | 10/2006 | Yu et al. | 257/98 |
| 2006/0267031 A1 | 11/2006 | Tasch et al. | |
| 2007/0007558 A1 | 1/2007 | Mazzochette | 257/239 |
| 2007/0041101 A1 | 2/2007 | Goosey et al. | 259/676 |
| 2007/0090383 A1 | 4/2007 | Ota et al. | |
| 2007/0268694 A1* | 11/2007 | Bailey et al. | 362/231 |
| 2008/0023689 A1 | 1/2008 | Kim et al. | 257/13 |
| 2008/0036364 A1 | 2/2008 | Li et al. | |
| 2008/0074032 A1 | 3/2008 | Yano et al. | |
| 2011/0193057 A1 | 8/2011 | Sabathil et al. | |

FOREIGN PATENT DOCUMENTS

| | | | |
|---|---|---|---|
| EP | 0881666 A2 | 12/1998 | |
| EP | 0936682 A | 8/1999 | |
| EP | 0936682 A | 8/1999 | |
| EP | 1189289 A1 | 3/2002 | |
| EP | 1313187 A1 | 5/2003 | |
| EP | 1653255 | 5/2006 | |
| EP | 1681509 | 7/2006 | |
| EP | 2048718 | 4/2009 | |
| FR | 2586844 | 3/1987 | |
| FR | 2759188 | 8/1998 | |
| FR | 2814220 | 3/2002 | |
| JP | 11330552 | 11/1966 | |
| JP | S62138841 A | 6/1987 | |
| JP | S63-288061 | 11/1988 | |
| JP | H05-075101 | 3/1993 | |
| JP | H05-283672 | 10/1993 | |
| JP | 3191447 | 5/1994 | |
| JP | 6268257 A | 9/1994 | |
| JP | 7162038 A | 6/1995 | |
| JP | 7176826 A | 7/1995 | |
| JP | 8023124 A | 1/1996 | |
| JP | 8070139 A | 3/1996 | |
| JP | 8162671 A | 6/1996 | |
| JP | 8274414 A | 10/1996 | |
| JP | 9330630 A | 12/1996 | |
| JP | 9148678 A | 6/1997 | |
| JP | 9153642 A | 6/1997 | |
| JP | 9162444 A | 6/1997 | |
| JP | 11040850 | 7/1997 | |
| JP | 9219556 A | 8/1997 | |
| JP | 10012969 A | 1/1998 | |
| JP | 10041581 A | 2/1998 | |
| JP | 10065271 | 3/1998 | |
| JP | 10145000 A | 5/1998 | |
| JP | 10145002 A | 5/1998 | |
| JP | H10312990 A | 11/1998 | |
| JP | 10033557 A | 12/1998 | |
| JP | 11074562 A | 3/1999 | |
| JP | 11186659 A | 7/1999 | |
| JP | 11191638 A | 7/1999 | |
| JP | 11224972 A | 8/1999 | |
| JP | 11238945 A | 8/1999 | |
| JP | 11251684 A | 9/1999 | |
| JP | 11298090 A | 10/1999 | |
| JP | 2000-049363 | 2/2000 | |
| JP | 0068594 A | 3/2000 | |
| JP | 2000-150920 | 5/2000 | |
| JP | 2000133883 A | 5/2000 | |
| JP | 2000150956 A | 5/2000 | |
| JP | 2000244072 A | 9/2000 | |
| JP | 2000307149 A | 11/2000 | |
| JP | 2001168471 | 6/2001 | |
| JP | 2001217467 A | 8/2001 | |
| JP | 2001332770 A | 11/2001 | |
| JP | 2002512379 | 4/2002 | |
| JP | 2002270515 A | 9/2002 | |
| JP | 2002543594 | 12/2002 | |
| JP | 2002543594 A | 12/2002 | |
| JP | 2003-59938 | 2/2003 | |
| JP | 2003-152219 | 5/2003 | |
| JP | 2003209283 A | 7/2003 | |
| JP | 2003218383 A | 7/2003 | |
| JP | 2003258313 A | 9/2003 | |
| JP | 2003318449 A | 11/2003 | |
| JP | 2003533030 A | 11/2003 | |
| JP | 2004276383 | 10/2004 | |
| JP | 2004281605 | 10/2004 | |
| JP | 2005191514 A | 7/2005 | |
| JP | 2005228833 | 8/2005 | |
| JP | 2007-036010 | 2/2007 | |
| JP | 2007-189239 | 7/2007 | |
| JP | 2007189239 | 7/2007 | |
| JP | 2009094517 | 4/2009 | |
| WO | WO 9831055 A1 | 7/1998 | |
| WO | WO 98/37585 A1 | 8/1998 | |
| WO | WO 9856043 | 12/1998 | |
| WO | WO 9905728 A1 | 2/1999 | |
| WO | WO 9946822 A1 | 9/1999 | |
| WO | WO 0021143 | 4/2000 | |
| WO | WO 0076004 A1 | 12/2000 | |
| WO | WO 01-41224 | 6/2001 | |
| WO | WO 02-01608 | 1/2002 | |
| WO | WO 0205399 A1 | 1/2002 | |
| WO | WO 02/11212 A | 2/2002 | |
| WO | 03044870 | 5/2003 | |
| WO | WO03080763 A1 | 10/2003 | |
| WO | WO 2004084316 | 9/2004 | |
| WO | WO 2004084316 A2 | 9/2004 | |

(56) References Cited

FOREIGN PATENT DOCUMENTS

| WO | WO 2004109813 | 12/2004 |
|---|---|---|
| WO | WO 2004109813 A2 | 12/2004 |
| WO | WO 2005/098976 A | 10/2005 |
| WO | WO 2005098976 A2 | 10/2005 |
| WO | WO 2005119799 | 12/2005 |
| WO | WO 2007005844 A2 | 1/2007 |
| WO | WO 2007075815 | 7/2007 |
| WO | WO 2008/020913 | 2/2008 |
| WO | WO 2008020913 | 2/2008 |

OTHER PUBLICATIONS

Sakai et al., "Experimental Investigation of Dependence of Electrical Characteristics on Device Parameters in Trench MOS Barrier Shottky Diodes", Proceedings of 1998 International Symposium on Power Semiconductor Devices & ICs, Kyoto, pp. 293-296, Jun. 1998.
Zhang AP et al, "Comparison of GAN P-I-N and Schottky Rectifier Performance" IEEE Transactions on Electron Devices, IEEE Inc. New York, US, vol. 48, No. 3, pp. 407-411, Mar. 2001.
European Search Report, Feb. 24, 2009, re related European Application No. EP 08253301.
Official Communication from the EPO regarding related European Application 08253301.9, dated: Nov. 17, 2009.
Second Office Action from related Chinese Application No. 200710142217.6, dated: Nov. 6, 2009.
Office Action from related U.S. Appl. No. 11/600,617, dated: Dec. 22, 2009.
Official Communication from the EPO regarding related European Application 08253301.9. dated: Nov. 17, 2009.
Nichia Corp. White LED, Part No. NSPW300BS (2004).
Nichia Corp. White LED, Part No. NSPW312BS (2004).
Cree™ XLamp™ XR-E and XR-C LED Binning and Labeling, pp. 1-11 (2007).
Notice of First Office Action from related China Patent Application No. 200710142217.6, dated: Jun. 22, 2009.
The Second Office Action from People's Republic of China, re: China Application No. 200480027969.2, Date: Jul. 4, 2008.
Copending U.S. Appl. No. 11/443,741, date: Jun. 14, 2007.
Copending U.S. Appl. No. 11/685,761, date: Mar. 13, 2007.
Copending U.S. Appl. No. 11/939,059, date: Nov. 13, 2007.
PCT Search Report and Written Opinion PCT/US2007/086237, date: May 8, 2008 in related application.
PCT Search Report and Written Opinion PCT/US2007/12403, Date: Aug. 6, 2008.
PCT Search Report and Written Opinion PCT/US2007/086242, Date: Mar. 4, 2008.
U.S. Appl. No. 11/613,692, filed Dec. 20, 2006.
U.S. Appl. No. 11/614,180, filed Dec. 21, 2006.
U.S. Appl. No. 11/624,811, filed Jan. 19, 2007.
U.S. Appl. No. 11/743,754, filed May 3, 2007.
U.S. Appl. No. 11/751,982, filed May 22, 2007.
U.S. Appl. No. 11/753,103, filed May 24, 2007.
U.S. Appl. No. 11/751,990, filed May 22, 2007.
U.S. Appl. No. 11/755,153, filed May 30, 2007.
U.S. Appl. No. 11/856,421, filed Sep. 17, 2007.
U.S. Appl. No. 11/859,048, filed Sep. 21, 2007.
U.S. Appl. No. 11/939,047, filed Nov. 13, 2007.
U.S. Appl. No. 11/936,163, filed Nov. 7, 2007.
U.S. Appl. No. 11/843,243, filed Aug. 22, 2007.
U.S. Appl. No. 11/939,052, filed Nov. 13, 2007.
U.S. Appl. No. 11/736,799, filed Apr. 18, 2007.
U.S. Appl. No. 11/877,038, filed Oct. 23, 2007.
U.S. Appl. No. 11/870,679, filed Oct. 11, 2007.
U.S. Appl. No. 11/948,041, filed Nov. 30, 2007.
U.S. Appl. No. 11/949,222, filed Dec. 3, 2007.
U.S. Appl. No. 12/174,053, filed Jul. 16, 2008.
U.S. Appl. No. 12/002,429, filed Dec. 4, 2007.
U.S. Appl. No. 12/045,729, filed Mar. 11, 2008.
U.S. Appl. No. 11/818,818, filed Jun. 14, 2007.

International Search Report for PCT/US2008/004453, Date: Sep. 9, 2008.
Written Opinion for PCT/US2008/004453, Date: Sep. 9, 2008.
Kim J K et al. "Strongly Enhanced Phosphor Efficiency in GaInN White Light-Emitting Diodes Using Remote Phosphor Configuration and Diffuse Reflector Cup", Japanese Journal of Applied Physics, Japan Society of Applied Physics, Tokyo, JP, vol. 44, No. 20-23, Jan. 1, 2005, XP-001236966.
Canadian Patent Application No. 2,454,310, Office Action dated Feb. 9, 2010.
Notification of National Application Upon the Preliminary Examination of a Patent Application for Chinese Patent Application No. 200880100370.5 mailed Jun. 1, 2010.
Notification of Publication and Entry into Procedure of Substantive Examination of Invention Patent Application for Chinese Patent Application No. 200880100370.5 mailed Jun. 1, 2010.
Invitation to Submit Applicant's Opinion (Summary) in Japanese Appeal Filing No. 2009-007421, Japanese Patent Application No. 2003-529535 mailed Dec. 7, 2010.
Examiner's Report to the Board (Summary) in Japanese Appeal Filing No. 2009-007421, Japanese Patent Application No. 2003-529535 mailed Dec. 7, 2010.
Office Action from U.S. Appl. No. 11/498,418, dated Dec. 16, 2009.
Response to Office Action from U.S. Appl. No. 11/498,418, filed Apr. 16, 2010.
Office Action from U.S. Appl. No. 11/498,418, dated Sep. 15, 2010.
Response to Office Action from U.S. Appl. No. 11/498,418, filed Dec. 13, 2010.
Office Action from U.S. Appl. No. 12/151,089, dated May 11, 2010.
Response to Office Action from U.S. Appl. No. 12/151,089 filed Oct. 11, 2010.
Office Action from U.S. Appl. No. 11/982,275, dated Jan. 13, 2011.
Office Action from U.S. Appl. No. 11/173,035, dated Apr. 1, 2010.
Response to Office Action from U.S. Appl. No. 11/173,035, filed Jun. 1, 2010.
Office Action from U.S. Appl. No. 11/982,275, dated: Aug. 20, 2010.
Response to Office Action from U.S. Appl. No. 11/982,275 filed Nov. 9, 2010.
Office Action from U.S. Appl. No. 11/173,035, dated: Oct. 6, 2010.
Examiners interview in response to Office Action from U.S. Appl. No. 11/173,0354 dated: Feb. 16, 2011.
Office Action from U.S. Appl. No. 11/900,952, dated: Feb. 26, 2010.
Response to Office Action from U.S. Appl. No. 11/900,952 filed May 26, 2010.
Office Action from U.S. Appl. No. 11/818,818, dated: May 11, 2010.
Response to Office Action from U.S. Appl. No. 11/818,818, filed Oct. 19, 2010.
Office Action from U.S. Appl. No. 11/900,952, dated: Jul. 23, 2010.
Response to Office Action from U.S. Appl. No. 11/900,952 filed Dec. 22, 2010.
Summary of Decision of Rejection from Japanese Patent Application No. 2008-262602, dated May 8, 2012.
Notice of Reasons for Rejection for Japanese Patent Application No. JP 2007-143451 dated May 10, 2011.
Extended Search Report for European Patent Application No. 11154411.0 dated May 30, 2011.
Singh Madhusudan, et al., "Examination of Tunnel Junctions in the AlGaN/GaN System: Consequences of Polarization Charge", Applied Physics Letters, AIP, American Institute of Physics, Melville, NY, vol. 77, No. 12, Sep. 18, 2000, pp. 1867-1969.
Panda A.K. et al., "DC and High-Frequency Characteristics of GaN Based Impatts", IEEE Transactions on Electron Devices, IEEE Service Center, Piscataway, NJ, US vol. 48, No. 4, Apr. 1, 2001, pp. 820-823.
Summary of Notice of Reasons for Rejection for counterpart Japanese Patent Application No. 2008-262602 mailed Jul. 12, 2011.
Office Action for Canadian Patent Application No. 2,454,310 dated Aug. 30, 2011.
Summary of Notice of Reasons for Rejection for Japanese Patent Application No. JP 2007-292302 dated Oct. 4, 2011.
Summary of Notice of Reasons for Rejection for Japanese Patent Application No. 2008-264568 mailed Nov. 15, 2011.

(56) References Cited

OTHER PUBLICATIONS

Summary of Notice of Reasons for Rejection for Japanese Patent Application No. 2008-182592 mailed Nov. 22, 2011.
M.A.L. Johnson, et al., New UV Light Emitter Based on AlGaN Heterostructures with Graded Electron and Hole Injectors, Mat. Res. Soc. Symp. Proc. vol. 743, 2003, pp. 481-486.
Simon, John, et al., Polarization-Induced 3-Dimension Electron Slabs in Graded AlGaN Layers, Material Res. Soc. Symp. vol. 892, 2006, pp. 417-422.
Summary of Notice of Reasons for Rejection for Japanese Patent Application No. 2007-292302 mailed Jan. 24, 2012.
Examination Report for European Patent Application No. 07254498.4 dated Jan. 26, 2012.
"The American Heritage Dictionary", Library of Congress, New College Ed., 1976, pp. 867.
"Properties of Delta Doped A10.25Ga0.75N and GaN Epitaxial Layers", Jeffrey S. Flynn, et al. Materials Research Society, 1 page.
"III-nitride ultraviolet light-emitting diodes with delta doping", K.H. Kim, et al. Applied Physics Letters, vol. 83, No. 3, Jul. 21, 2003, pp. 566-568.
Reduction of threading edge dislocation density in n-type GaN by Si delta-doping, Y.B. Pan, et al. Journal of Crystal Growth 286 (2006) 255-258.
Epitaxial Growth and Characterisation of Silicon Delta-Doped GaAs, AlAs and AlxGal-xAs, B. Sciana, et al. Crystal Res. Technol. 36 2001 8-10, pp. 1145-1154.
"Effects of periodic delta-doping on the properties of GaN:Si films grown on Si (111) substrates" L.S. Wang, et al. Applied Physics Letters, vol. 85, No. 34, Dec. 13, 2004, pp. 5881-5884.
"The effect of periodic silane burst on the properties of GaN on Si (111) substrates", Zang Keyan, et al. Singapore—MIT Alliance, E4-04-10 & Dept. of Materials Science and Engineering 4 pages.
European Search Report, EP 03 07 8515, dated: Feb. 2, 2004.
Partial European Search Report, EP 09 15 7557, dated: May 28, 2009.
Non-final Rejection, Korean Appl. No. 10-2003-7012710, dated: Aug. 8, 2008.
Non-final Rejection, Korean Appl. No. 10-2008-7026427, dated: Jan. 23, 2009.
Decision of Rejection and Decision of Dismissal of Amendment from Japanese Patent Application No. 2007-143451, dated Nov. 13, 2012.
Examination of European Patent Application No. 08 253 301.9 - 2222. dated Apr. 24, 2012.
Decision for Grant for Japanese Patent Application No. 2008-182592, dated Jul. 3, 2012.
Notice of Reasons for Rejection for Japanese Patent Application No. 2007-143451, dated Jul. 31, 2012.
Appeal Board's Questioning from Japanese Patent Application No. 2008-262602, dated Dec. 14. 2012.
Official Action from European Patent Appl. No. 11154411.0, dated Feb. 27, 2013.
Decision of Patent Grant from Japanese Patent Application No. 2007-143451, dated Apr. 16, 2013.
M. Hansen, et al., "Effect of AlGaN/GaN Strained Layer Superlattice Period on InGaN MQW Laser Diodes", phys. Stat. sol. (a) 176, (1999) pp. 59-62.
Examination Report from European Patent Appl. No. 07 254 498.1, dated Aug. 9, 2013.
Decision of Appeal from Japanese Patent Appl. No. 2008-2626172. dated Jul. 5. 2013.
Office Action from U.S. Appl. No. 11/900,952, dated May 14, 2012.
Response to OA from U.S. Appl. No. 11/900,952, filed Sep. 14, 2012.
Office Action from U.S. Appl. No. 11/900,952, dated Nov. 17, 2011.
Response to OA from U.S. Appl. No. 11/900,952, filed Mar. 19, 2012.
Office Action from U.S. Appl. No. 11/974,431, dated Jul. 9, 2012.
Response to OA from U.S. Appl. No. 11/974,431, filed Sep. 26, 2012.
Office Action from U.S. Appl. No. 13/045,246, dated Apr. 5, 2012.
Response to OA from U.S. Appl. No. 13/045,246, filed Jul. 2, 2012.
Office Action from U.S. Appl. No. 13/045,246, dated Dec. 5, 2012.
Response to OA from U.S. Appl. No. 13/045,246, filed Feb. 21, 2013.
Office Action from U.S. Appl. No. 11/900,952, dated Jan. 15, 2013.
Response to OA from U.S. Appl. No. 11/900,952, filed Apr. 9, 2013.
Office Action from U.S. Appl. No. 13/045,246, dated Aug. 28, 2012.
Response to OA from U.S. Appl. No. 13/045,246, filed Oct. 16, 2012.
Office Action from U.S. Appl. No. 12/905,374, dated Mar. 27, 2012.
Response to OA from U.S. Appl. No. 12/905,374, filed Jun. 27, 2012.
Office Action from U.S. Appl. No. 12/826,305, dated Apr. 4, 2013.
Response to DA from U.S. Appl. No. 12/826,305, filed Jul. 1, 2013.
Examination Report from Canadian Patent Appl No. 2,454,310, dated Sep. 5, 2013.
Office Action from U.S. Appl. No. 13/954,034, dated Oct. 24, 2013.
Office Action from U.S. Appl. No. 11/676,715, dated Feb. 14, 2013.
Response to OA from U.S. Appl. No. 11/676,715, filed May 1, 2013.
European Examination from EU Appl. No. 08 160 129.6-1564, dated Jan. 21, 2014.
Office Action from U.S. Appl. No. 11/676,715, dated Feb. 19, 2014.
Interrogation from Japanese Patent App. No. 2006-533962, dated Dec. 10, 2013.
Office Action from European Patent Appl. No. 11154411.0-1555, dated Jun. 6. 2014.
Office Action from U.S. Appl. No. 13/693,929, dated May 6, 2014.
Office Action from U.S. Appl. No. 11/676,715, dated May 21, 2014.
Office Action from U.S. Appl. No. 13/954,034, dated Sep. 4, 2014.
Response to OA from U.S. Appl. No. 13/954,034, filed Oct. 24, 2014.
Office Action from U.S. Appl. No. 11/676,715, dated Sep. 26, 2014.
Summons to attend oral proceedings from European Appl. No. 08253301.9-1564, dated Dec. 12. 2014.
Intention to Grant from European Patent Appl. No. 11 154 411.0-1555, dated Nov. 17, 2014.

* cited by examiner

| | Blue Wavelength/nm | | |
|---|---|---|---|
| | 440 | 450 | 460 |
| Blue Emitter Intensity | 1 | 1 | 1 |
| 560nm Phosphor Intensity | 0.287 | 0.190 | 0.0 |
| 570nm Phosphor Intensity | 0.301 | 0.422 | 0.546 |

| | Blue Wavelength/nm | | |
|---|---|---|---|
| | 440 | 450 | 460 |
| LED Package ccx | 0.3249 | 0.325 | 0.3249 |
| LED Package ccy | 0.3343 | 0.3344 | 0.3347 |
| LED Package CCT | 5853 | 5850 | 5853 |

| | Blue Wavelength/nm | | |
|---|---|---|---|
| | 440 | 450 | 460 |
| Blue Emitter Intensity | 1 | 1 | 1 |
| 550nm Phosphor Intensity | 0.31 | 0.285 | 0.194 |
| 580nm Phosphor Intensity | 0.306 | 0.356 | 0.377 |

| | Blue Wavelength/nm | | |
|---|---|---|---|
| | 440 | 450 | 460 |
| LED Package ccx | 0.325 | 0.325 | 0.3251 |
| LED Package ccy | 0.3344 | 0.3344 | 0.3354 |
| LED Package CCT | 5850 | 5850 | 5843 |

|  | Blue Wavelength/nm | | |
|---|---|---|---|
|  | 440 | 450 | 460 |
| Blue Emitter Intensity | 1 | 1 | 1 |
| 560nm Phosphor Intensity | 1.106 | 1.145 | 1.015 |
| 630nm Phosphor Intensity | 1.906 | 2.029 | 1.888 |

|  | Blue Wavelength/nm | | |
|---|---|---|---|
|  | 440 | 450 | 460 |
| LED Package ccx | 0.452 | 0.452 | 0.452 |
| LED Package ccy | 0.409 | 0.409 | 0.409 |
| LED Package CCT | 2800 | 2800 | 2800 |

US 9,012,937 B2

MULTIPLE CONVERSION MATERIAL LIGHT EMITTING DIODE PACKAGE AND METHOD OF FABRICATING SAME

BACKGROUND OF THE INVENTION

1. Field of the Invention

This invention relates to emitters having conversion materials, and in particular to solid state emitters having multiple conversion materials to compensate for emitter wavelength variations.

2. Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and extracted to the surrounding ambient from all transparent surfaces of the LED.

Conventional LEDs cannot generate white light from their active layers. Light from a blue emitting LED has been converted to white light by surrounding the LED with a yellow phosphor, polymer or dye, with a typical phosphor being cerium-doped yttrium aluminum garnet (Ce:YAG). [See Nichia Corp. white LED, Part No. NSPW300BS, NSPW312BS, etc.; See also U.S. Pat. No. 5,959,316 to Lowrey, "Multiple Encapsulation of Phosphor-LED Devices"]. The surrounding phosphor material "downconverts" the wavelength of some of the LED's blue light, changing its color to yellow. Some of the blue light passes through the phosphor without being changed while a substantial portion of the light is downconverted to yellow. The LED emits both blue and yellow light, which combine to provide a white light. In another approach light from a violet or ultraviolet emitting LED has been converted to white light by surrounding the LED with multicolor phosphors or dyes.

Current white LEDs are fabricated in packages by selecting the phosphor or down-conversion material based on their emission properties alone. Preferably, the phosphor or converter material provides a broad and flat excitation spectrum to achieve a constant brightness of phosphor emission even if the LED wavelength is changing. The result is the Lumen output of the white LED is relatively constant independent of the blue LED emission wavelength.

These packages, although fabricated pursuant to controlled methods and standards, can experience variations of the color or hue of the combined light from the LED and the phosphor or converter material. This can be caused by, for example, variations in the amount of phosphor or conversion material covering the LED. In other packages this variation can be caused by other factors such as material composition variations introduced during the LED device fabrication. For example, during the fabrication of gallium nitride based devices, the active region in different devices fabricated from the same or different wafers can have slightly different compositions, such as a varying indium concentration in devices having an indium gallium nitride active region. These different compositions can result in the active region emitting different wavelengths of light. White LED packages and LED systems fabricated using a single phosphor and such blue emitters can suffer from a variation of the color point depending on the LED emission wavelength. These emission variations are difficult to prevent and thus devices or packages utilizing such LEDs in combination with phosphors or converter materials can emit many different colors or hues of white or mixed color light.

The human eye is relatively sensitive to variations in emission wavelengths and white hue, and can detect relatively small differences in emission wavelengths or color. Perceptible variations in color emitted by packages designed to emit a single color of light can reduce customer satisfaction and reduce overall acceptance of LED packages for commercial uses. To ensure that the LEDs provided to the end customer emits light within an acceptable color range, LEDs can be tested and sorted by color or brightness into different bins, generally referred to in the art as binning. Each bin typically contains LEDs from one color and brightness group and is typically identified by a bin code. White emitting LEDs can be sorted by chromaticity (color) and luminous flux (brightness). Color LEDs can be sorted by dominant wavelength (color) and luminous flux (brightness), or in the case of certain colors such as royal blue, by radiant flux (brightness). LEDs can be shipped, such as on reels, containing LEDs from one bin and are labeled with the appropriate bin code.

FIG. 1 shows one example of binning chromaticity regions plotted on the 1931 CIE Coordinate system for commercially available white emitting Cree® XLamp® XR-E and XR-C LEDs provided by Cree Inc. Each of these regions corresponds to a particular chromaticity range of white LEDs with the regions shown surrounding the black body curve or black body locus (BBL). Each of these regions is designed to designate chromaticity variations that are within acceptable ranges to the human eye. For example, region WF designates a particular region having substantially imperceptible chromaticity variations such that LEDs emitting within this region would be binned together.

This binning process typically lowers the product yield and increases the manufacturing cost of LEDs by the overhead associated with the testing and separation of devices with different emission characteristics, and the formulation of the data and records surrounding this process. The greater the number of bins for a particular LED being manufactured, the greater the additional cost associated with the binning process. This in turn can result in increased cost for the LEDs and related packages.

SUMMARY OF THE INVENTION

The present invention is directed to reducing or eliminating the change of emission color point emitted by packages using LEDs that emit at a range of different wavelengths. One embodiment of an emitter package according to the present invention comprising a light emitting diode (LED) emitting light at a wavelength within a wavelength range and a plurality of phosphors. Each of the phosphors absorbs at least some light from the LED and re-emits a different wavelength of light. The package emits a combination of light from the LED and the plurality of phosphors, with the phosphors having emission wavelengths and characteristics such that the emitter package emits light within a standard deviation of a target color for LEDs emitting at any of the wavelengths with the wavelength range.

Another embodiment of emitter package according to the present invention comprises a light emitting diode (LED) emitting at a wavelength within a wavelength range and two phosphors. Each of the phosphors is arranged to absorb light emitted from the LED and re-emit a different wavelength of light. Each of the conversion materials has a respective peak re-emission wavelength and excitation characteristic, with the phosphors arranged to compensate for different wavelength emissions of the LED such that the emission of the package is controlled to fall within a MacAdam ellipses on a CIE color coordinate system.

One embodiment of a method for fabricating emitter packages according to the present invention comprises fabricating a plurality of LEDs, each of the LEDs emitting at a wavelength within a range of wavelengths. Each of the LEDs are arranged in a respective package with a plurality of conversion materials so that at least some light from each of the LEDs is absorbed and re-emitted by its corresponding conversion material. The plurality of conversion materials have emission and excitation characteristics that compensate for different LED emission wavelengths within the LED range of wavelengths such that each of the LED packages emits light within a standard deviation from a target color.

Another embodiment of a method for fabricating emitter packages comprises fabricating a plurality of LEDs, each of which emits light within a range of wavelengths. A plurality of phosphors are provided each of which is capable of absorbing light within the range of LED wavelengths and re-emitting light at a respective peak wavelength. A portion of the plurality of phosphors is arranged in a package of said LEDs such that each portion absorbs at least some light from its LED and re-emits light. Each package emits a combination of light from the LED and its corresponding portion of said phosphors, with the phosphors compensating for LEDs emitting at different wavelengths such that each of the LED packages emits light within a standard deviation of a target color.

These and other aspects and advantages of the invention will become apparent from the following detailed description and the accompanying drawings which illustrate by way of example the features of the invention.

BRIEF DESCRIPTION OF THE DRAWINGS

FIG. 2b is an exploded perspective view of the LED package in FIG. 2a;

FIG. 3b is a 1931 CIE Coordinate system showing the target correlated color temperature (CCT) for a package using the phosphors of FIG. 3a;

FIG. 3c is a table showing the phosphor emission characteristics for packages using the phosphor blend in FIG. 3a at emitters at three different LED emission wavelengths;

FIG. 3d is a graph showing the emission spectra of a package at one emitter wavelength using the phosphor blend in FIG. 3a;

FIG. 3e is a graph showing the emission spectra of a package at a higher emitter wavelength using the phosphor blend in FIG. 3a;

FIG. 3f is a graph showing the emission spectra of a package at a higher emitter wavelength using the phosphor blend of FIG. 3a;

FIG. 4c is a graph showing the emission spectra of a package at one emitter wavelength using the phosphor blend in FIG. 4a;

FIG. 4d is a graph showing the emission spectra of a package at a higher emitter wavelength using the phosphor blend in FIG. 4a;

FIG. 4e is a graph showing the emission spectra of a package at a higher emitter wavelength using the phosphor blend of FIG. 4a;

DETAILED DESCRIPTION OF THE INVENTION

Figure 1:
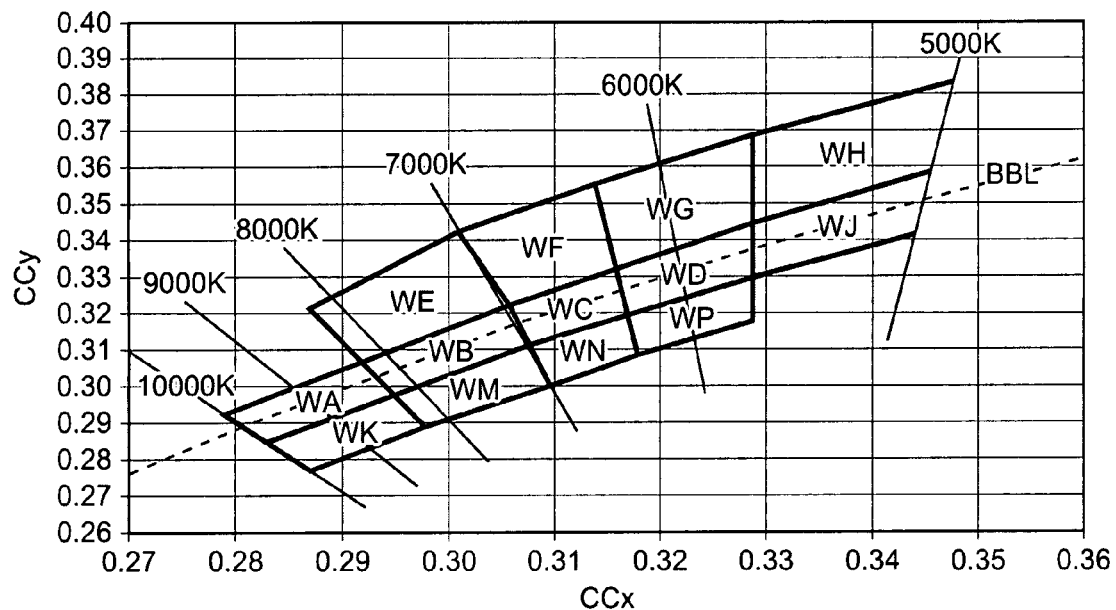
FIG. 1 is a graph showing chromaticity regions plotted on the 1931 CIE Coordinate system.

The present invention is directed to reducing or eliminating the change of emission color point in LED packages or LED assemblies ("LED packages") having conversion materials to down convert (i.e. increase the wavelength) light. The present invention is particularly applicable to maintaining the white emission color point in white LED packages. These packages can utilize blue LEDs having varying emission wavelengths, usually within an acceptable range and to control the emission color point from the package, the conversion material is designed to compensate for the LED emission variations. The conversion material utilizes two or more phosphors with different, specifically tailored excitation characteristics and emission spectra relative to the target white color point. In one embodiment two phosphors are used having their emission points suitably offset with respect to the target white color point and having the desired excitation and emission properties that compensate for the wavelength shift of the LED.

Commercially available phosphors can be used provided they have the excitation and emission properties as prescribed in this invention, matched to the blue LED emission wavelength variation range. Alternatively, phosphors with the desired characteristics can be fabricated or engineered using known methods. The result is white LED packages having tighter emission distribution during manufacturing, which in turn reduces the amount of binning required. The tighter emission distribution also provides a more consistent emitter that can promote market adoption of LEDs for many applications.

One method for measuring the target emission for LED packages according to the present invention is by standard deviation from a target color, with one example being deviation by MacAdam Ellipses on the CIE color (chromaticity) coordinate system. These ellipses are generally known in the art and only briefly discussed herein. They are defined to establish the boundaries of how far colors of light can deviate from the target before a difference in the target light is perceived. MacAdam ellipses are described as having "steps" or "standard deviations". For example, any point on the boundary of a "1-step" ellipse drawn around the target represents one standard deviation from the target. The present invention preferably provides LED packages that have color point deviations within 3 or 4-step MacAdam ellipses around a particular color target, although the lower the deviation the better. Other embodiments can also have deviations greater than the 4-step MacAdam ellipses.

The invention will now be discussed with reference to certain embodiments. It is understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of idealized embodiments of the invention. As such, variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

The present invention can be used in conjunction with many different solid state emitters, with the embodiment of the invention below being described in relation to an LED and in particular a white emitting LED package. It is understood that the present invention can also be used in other solid state emitter packages beyond the embodiment shown, from simple "metal cup" packages known in the art, to more complex packages. The present invention can also be used with multiple emitter packages, such as LED packages having more than one LED. The present invention can be used in any application wherein a conversion material is used to down-convert the wavelength of light from an emitter, and the discussion of the present invention with reference to the following embodiment should not be construed as limiting to the that particular embodiment or similar embodiments.

Figure 2A:
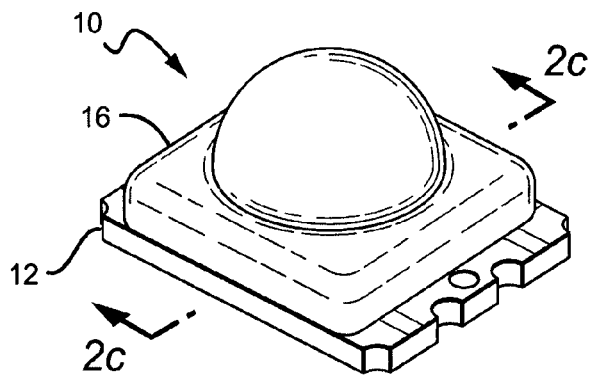
FIG. 2a is a perspective view of one embodiment of an LED package according to the present invention.
Figure 2B:
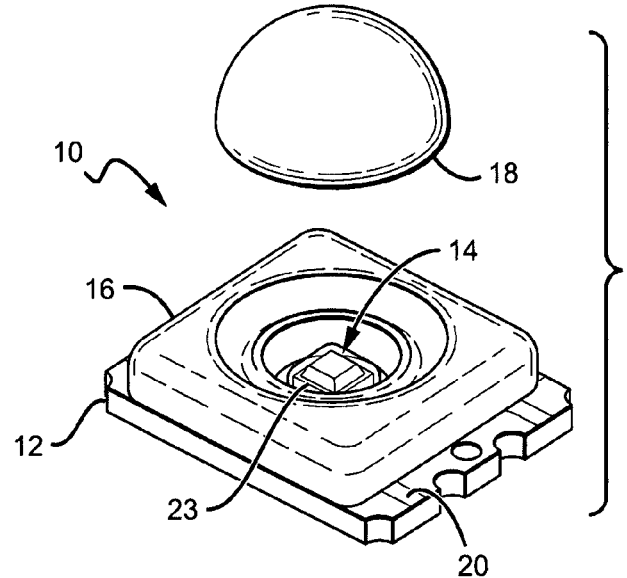
Figure 2C:
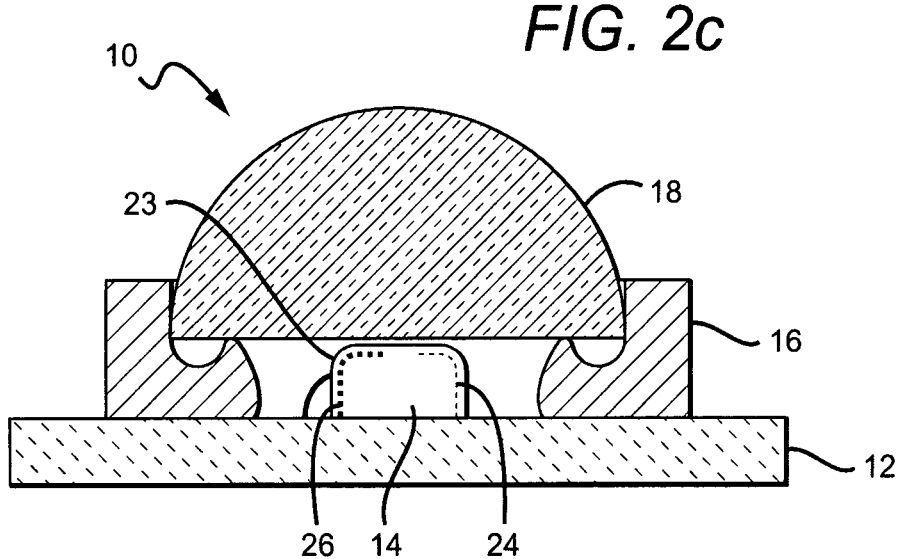
FIG. 2c is a sectional view of the LED package in FIG. 2a taken along section lines 2c-2c.

FIGS. 2a through 2c show one embodiment of an LED package 10 according to the present invention. The LED package 10 generally comprises a substrate/submount ("submount") 12, an LED 14 mounted on the substrate 12 and a reflector cup assembly ("reflector cup") 16 also mounted on the submount 12. Primary optics, such as a lens 18 can be placed over the LED 14, such as on the reflector cup 16 and bonded to the package using different mounting methods such that light from the LED 14 passes through the lens 18. For example, the space between the bottom of the lens 18 and the remainder of the package 10 can be filled with an encapsulating material such as a silicone polymer (not shown) with the bottom of the lens 18 in contact with the gel. The package 10 can then be heat cured, which causes the encapsulating material to solidify and adhere to the lens 18, bonding the lens 18 in place over the LED 14 and reflector cup 16. Many different lenses and encapsulating materials can be used in the packages according to the present invention to provide different output characteristics. Furthermore, lenses of various materials can also be mounted directly to the substrate without the reflector. Alternatively, lenses can be entirely omitted for other package embodiments.

The LED 14 can have many different semiconductor layers arranged in different ways. The fabrication and operation of LEDs is generally known in the art and only briefly discussed herein. The layers of the LED 14 can be fabricated using known processes with a suitable process being fabrication using metal organic chemical vapor deposition (MOCVD). The layers of the LEDs 14 generally comprise an active layer/region sandwiched between first and second oppositely doped epitaxial layers all of which are formed successively on a growth substrate. The LEDs are formed on a wafer and then singulated for mounting in a package. It is understood that the growth substrate can remain as part of the final singulated LED or the growth substrate can be fully or partially removed.

It is also understood that additional layers and elements can also be included in the LED 14, including but not limited to buffer, nucleation, contact and current spreading layers as well as light extraction layers and elements. The active region can comprise single quantum well (SQW), multiple quantum well (MQW), double heterostructure or super lattice structures. The active region and doped layers may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a preferred embodiment, the doped layers are gallium nitride (GaN) and the active region is InGaN. In alternative embodiments the doped layers may be AlGaN, aluminum gallium arsenide (AlGaAs) or aluminum gallium indium arsenide phosphide (AlGaInAsP).

The growth substrate can be made of many materials such as sapphire, silicon carbide, aluminum nitride (AlN), GaN, with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the substrate (as may be the case with some devices formed on sapphire). SiC substrates are available from Cree, Inc. Methods for producing them are set forth in the scientific literature as well as in U.S. Pat. Nos. Re. 34,861; 4,946,547; and 5,200,022.

The submount 12 may be formed in many different shapes and sizes and of many different materials with a preferred material being electrically insulating. Suitable materials include, but are not limited to ceramic materials such as aluminum oxide or aluminum nitride. Alternative substrate configurations could use electrically conductive metal lead frame assemblies that are bonded with thermoset or thermoplastic resin materials. The reflector cup 16 should be formed of durable, high melting temperature material that can withstand subsequent packaging manufacturing steps and the heat generated by the package during operation. Many different materials can be used, such as high melting temperature material including plastics, such as Novella resin, or liquid crystal polymers. The submount has a top surface comprising electrical traces 20 and a mounting pad (not shown), with LED 14 mounted to the mounting pad and the electrical traces 20 providing a conductive path for electrical connection to the LED 14 using known contacting methods.

According to the present invention, different conversion materials with different emission spectra can be used with the package 10 to help maintain the color point through different emission wavelengths of the LED 14. In the embodiment shown the conversion material 23 is shown covering the LED 14 and comprises a first phosphor material 24 and a second phosphor material 26 dispersed evenly over the LED 14. The second phosphor 26 is shown dark for illustrative purposes to distinguish from the first phosphor 24. The first and second phosphors 24, 26 can also be included in other areas of the package 10, including but not limited to the encapsulating material or the lens 18. The phosphors 24, 26 are shown with even distribution over the LED 14 although in other embodiments the phosphor 24, 26 can be segregated to a particular area and can have different concentrations over the LED 14. The phosphors 24, 26 are typically held on the LED by binder such as a silicone or epoxy.

Different characteristics of the phosphors 24, 26 can determine the amount of LED light that will be absorbed by the phosphors 24, 26 in the final LED packages, including but not limited to the size of the phosphor particles, the percentage/concentration of phosphor loading, the type of binder material, the excitation efficiency of the phosphor at the wavelength of emitted LED light, the internal phosphor efficiency, its emission wavelength, and the thickness of the lens having the phosphor materials. These different factors or characteristics can be varied to control the emission color of the LED package with the excitation efficiency and the respective emission wavelength being most important.

For the purpose of this invention the excitation efficiency is defined as the efficiency of the phosphor to down-convert light from the primary LED wavelength to a higher wavelength of lower energy. Thereby excitation efficiency is the product of the phosphor absorption efficiency for the primary LED light, the internal quantum efficiency of the phosphor down-conversion, and the light extraction efficiency from the phosphor particle. The product of the phosphor excitation efficiency and the intensity of the primary LED emission shall be the intensity of the down-converted phosphor emission. It is understood by someone skilled in the art that other factors like the reflection from the phosphor surface or the package geometry can affect the excitation efficiency as well.

Many different phosphors can be combined in LED packages according to the present invention to achieve the tight emission variation between LED packages. As mentioned above the present invention is particularly adapted to LED packages emitting white light. One embodiment of LED packages according to the present invention utilize LEDs that emit light in the blue wavelength spectrum and the phosphor absorbs some of the blue light and re-emits yellow. The LED chips emit a white light combination of blue and yellow light. In one embodiment the phosphors can comprise YAG:Ce materials, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). Other yellow phosphors that can be used for white emitting LED chips include:
$Tb_{3-x}R_xO_{12}$:Ce(TAG); RE=Y, Gd, La, Lu; or
$Sr_{2-x-y}Ba_xCa_ySiO_4$:Eu.

Additional phosphors can also be included for higher CRI white of different white hue (warm white) with the yellow phosphors above combined with red phosphors. Different red phosphors can be used including: $Sr_xCa_{1-x}S$:Eu, Y; Y=halide;
$CaSiAlN_3$:Eu; or
$Sr_{2-y}Ca_ySiO_4$:Eu Other phosphors can be used to create saturated color emission by converting substantially all light to a particular color. For example, the following phosphors can be used to generate green saturated light:
$SrGa_2S_4$:Eu;
$Sr_{2-y}Ba_ySiO_4$:Eu; or
$SrSi_2O_2N_2$:Eu.

The following lists some additional suitable phosphors used as conversion particles in an LED package according to the present invention, although this list is not exhaustive. Each exhibits excitation in the blue and/or UV emission spectrum, provides a desirable peak emission, has efficient light conversion, and has acceptable Stokes shift:
Yellow/Green
$(Sr,Ca,Ba)(Al,Ga)_2S_4$:Eu$^{2+}$
$Ba_2(Mg,Zn)Si_2O_7$:Eu$^{2+}$
$Gd_{0.46}Sr_{0.31}Al_{1.23}O_xF_{1.38}$:Eu$^{2+}_{0.06}$
$(Ba_{1-x-y}Sr_xCa_y)SiO_4$:Eu
$Ba_2SiO_4$:Eu$^{2+}$
Red
$Lu_2O_3$:Eu$^{3+}$
$(Sr_{2-x}La_x)(Ce_{1-x}Eu_x)O_4$
$Sr_2Ce_{1-x}Eu_xO_4$
$Sr_{2-x}Eu_xCeO_4$
$SrTiO_3$:Pr$^{3+}$,Ga$^{3+}$
$CaAlSiN_3$:Eu$^{2+}$
$Sr_2Si_5N_8$:Eu$^{2+}$ The specific combination of phosphor materials depends on the targeted color of the LED package and, as discussed further below, on the excitation characteristics required to maintain the desired color point tolerance for the LED package.

Different sized phosphor particles can be used including but not limited to 10-100 nanometer (nm)-sized particles to 20-30 μm sized particles, or larger. Smaller particle sizes typically scatter and mix colors better than larger sized particles to provide a more uniform light. Larger particles are typically more efficient at converting light compared to smaller particles, but emit a less uniform light. In one embodiment, the particle sizes are in the range of 2-5 μm. In other embodiments, the coating 32 can comprise different types of phosphors or can comprise multiple phosphor coatings for monochromatic or polychromatic light sources.

As mentioned a preferred embodiment of the present invention utilized a blue emitting LED and two different phosphors that absorb the blue emitted light and emit down-converted light, such that the LED package 10 emits white light. The phosphors are chosen to compensate for variations in the emission wavelength from blue emitting LEDs such that the packages utilizing these LEDs will emit at or close to a target color point, such as within a tight standard deviation. To achieve this target white emission from a range of LED emission wavelengths the phosphor emission compensates for the LED emission variations.

The variation of the LED emission wavelength is reflected by a change of its color point as represented by different color coordinates (ccx, ccy) on the 1931 CIE color diagram. For embodiments utilizing blue LED emissions as the primary light a longer blue wavelength results in a color point with higher ccy and a slightly lower ccx coordinate. The most pronounced and dominant factor for the change in color of the combined LED and phosphor emission from the LED package is the shift to higher ccy values. Conversely, a blue LED emission with a shorter wavelength results in a color point with lower ccy and a slightly higher ccx coordinate with the dominant factor for the change in color of the combined LED and phosphor emission from the LED package being the shift to lower ccy values.

Alternative color coordinate systems may be used as well to illustrate the impact of the blue wavelength variation and its effect on the LED package. The LED emission and phosphor excitation characteristics of this invention can be easily transformed by someone skilled in the art to these coordinate systems.

In one embodiment, when the blue emission is at longer wavelengths in the emission range (dominantly higher ccy), a first phosphor with its primary emission color point at a dominantly lower ccy relative to the white target emission on the 1931 CIE Coordinate system emits more intensely. When blue emission is at shorter wavelengths a second phosphor with its primary emission color point at dominantly higher ccy relative to the white target emission emits more intensely. By selecting two or more component phosphor blends with properly "tuned" excitation and emission characteristics to achieve this emission response, the white LED emission can be maintained within a tight tolerance irrespective of the blue excitation wavelength. Thereby the excitation efficiency of the first phosphor increases at longer wavelengths compared to shorter wavelengths. In contrast, the excitation efficiency of the second phosphor decreases at longer wavelengths compared to shorter wavelengths FIGS. 3a through 3g show one embodiment of the invention having two different phosphors emitting at two different wavelengths, each having a different excitation characteristic, used with a blue LED that can have emission wavelengths in the range of approximately 440 and 460 nm (full width of half maximum—FWHM approximately 25 nm). The target CCT of LED packages using these different wavelength LEDs is 5850 K on the black body locus (BBL). That is, the different phosphors provide emissions that compensate for the differences in LED emission wavelengths, with the emission of the packages designed to closely approximate this target CCT with the combination of blue from the LED 14 plus the light emitted from the first phosphor and the second phosphor. The target CCT 30 is shown on the BBL of the 1931 CIE Coordinate system shown in FIG. 3b. The respective change of phosphor emission intensity with different wavelengths of light from the LEDs can be accomplished as a result of the appropriate excitation spectra 36, 38 in FIG. 3c reflecting the relative excitation efficiency for the phosphors as shown and discussed below. The ability of the package to hit the target CCT, or within standard deviation, through changes in the LED emission wavelengths depends generally on the ability for the phosphor excitation spectra to match the change in the relative excitation efficiency 36, 38 for both phosphors through the range of blue emission wavelengths. It is understood that the prescription provided in FIGS. 3a-3g applies in general to LEDs and phosphors with the emission wavelengths, quantum efficiencies, and spectral widths (FWHM) as provided in FIG. 3c. However, the prescription can be modified by someone skilled in the art to adopt to different LED emissions, phosphor emissions of different wavelength, spectral widths, and different quantum efficiencies as described further below.

Figure 3A:
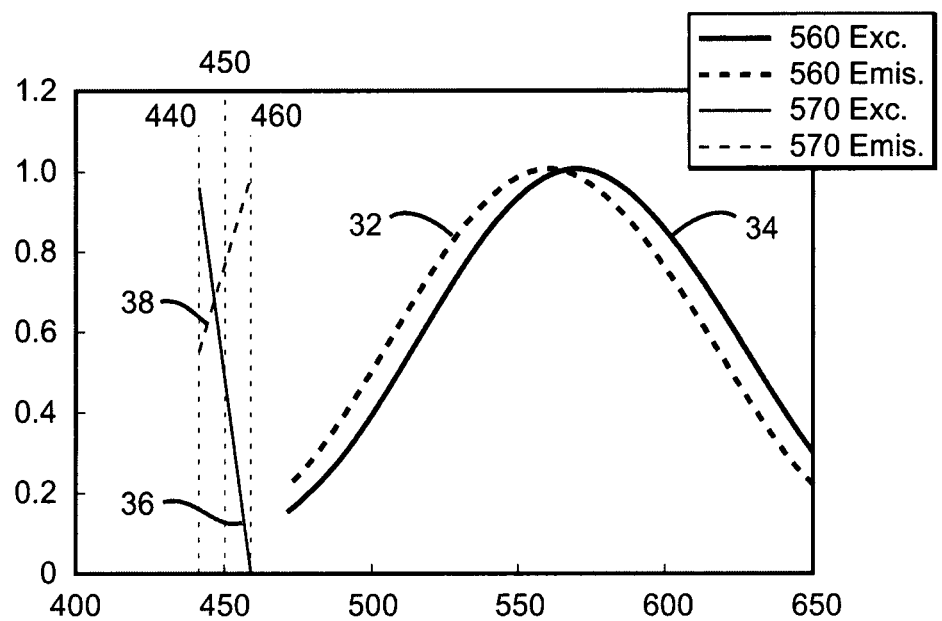
FIG. 3a is a graph showing relative excitation and emission spectra for one embodiment of a two phosphor blend according to the present invention.

The phosphor combination used in this embodiment comprises first and second phosphors having 560 and 570 nm peak emission wavelengths respectively, although other peak intensities with the appropriate characteristics can also be used. FIG. 3a is a graph showing the relative excitation and emission spectra of the first and second phosphors. The first phosphor emission spectrum 32 is shown with the emission characteristics having peak emission at 560 nm. The second phosphor emission spectrum 34 is shown with its peak emission at 570 nm. FIG. 3a also includes the first phosphor relative excitation spectrum 36 showing the excitation intensity of the first phosphor in response to an emitter emitting in the 440 nm to 460 nm emission range. The excitation of the first phosphor decreases relatively steeply through this emission range. By contrast, the second phosphor relative excitation spectrum 38 shows excitation intensity of the second phosphor through this same emission range with the emission intensity increasing. This combination of excitations from the phosphors having these characteristics, along with emission from the LED, produces emission at the target CCT from emitter emitting at the different wavelengths through this range.

Figures 3B, 3C:
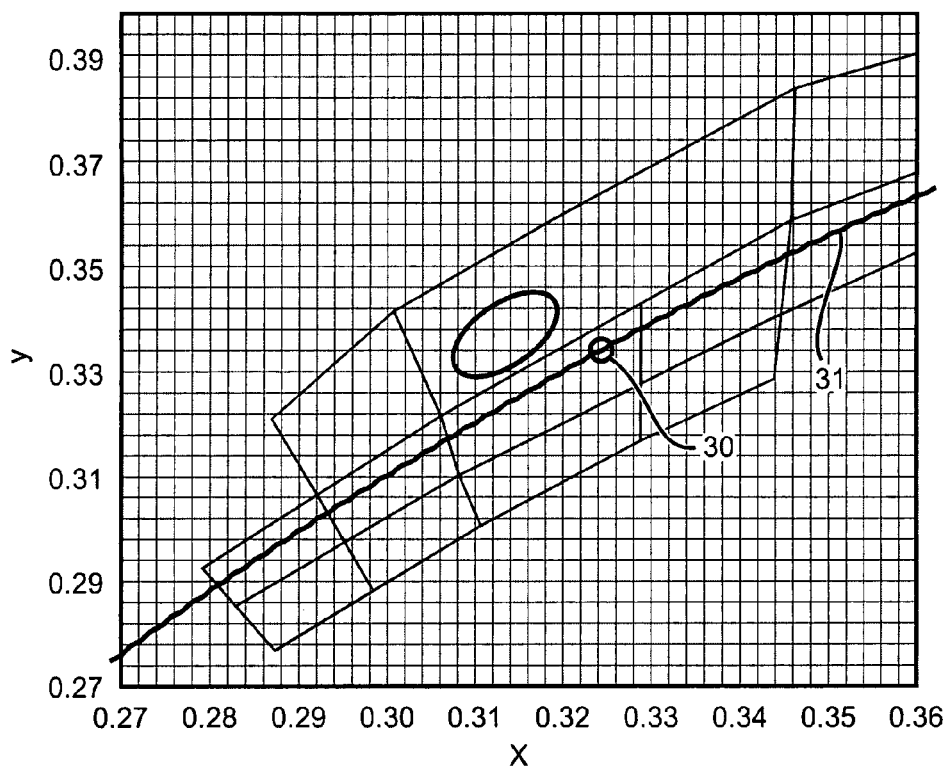

FIGS. 3c through 3g illustrate the operating characteristics of these phosphors with blue LEDs emitting at 440, 450 and 460 nm. FIG. 3c is a table showing emission intensities of the phosphors in the LED package for three different LED emission wavelengths. At 440 nm emission, the 560 nm phosphor emits at relative intensity of 0.287 while the 570 nm phosphor emits at a relative intensity of 0.301. This results in ccx and ccy coordinates for white LED of 0.3249 and 0.3343, which results in a CCT of approximately 5853 K. At 450 nm emission wavelength the 560 nm phosphor reduces excitation intensity to 0.190 and the 570 nm phosphor increases its excitation intensity to 0.422. The resulting ccx and ccy result in a CCT of 5850 K, very close to the LED package with the 440 nm LED emission. For the emission wavelength of 460 nm the 560 nm relative excitation intensity reduces to zero and the 570 nm relative excitation intensity increases to 0.560. The resulting ccx and ccy coordinates result in a CCT of 5853 K, again essentially identical to the LED package with the 440 nm and 450 nm LED emission. Throughout these ranges the color rendering index (CRI) and the spectral efficiency are maintained through this range of LED emission wavelengths.

It should be noted that the relative change in the first and second phosphor intensity in FIG. 3c is achieved by the relative change in the corresponding phosphor excitation efficiency thus enabling the tight tolerance of the color point. The shape of the actual excitation spectra can vary as long as the relative ratio of the excitation efficiency between the two phosphors with their respective emission remains similar to the prescription in FIGS. 3a, 3c.

Figure 3D:
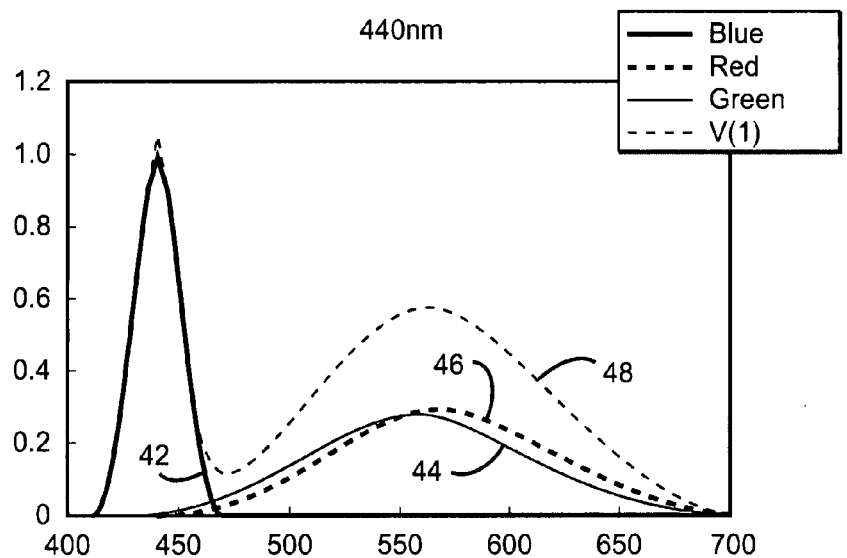

FIGS. 3d through 3g further illustrate the operating characteristics of an LED package with 560 and 570 nm phosphors at the LED emission wavelengths above. FIG. 3d is a graph showing emission intensities from an LED emitting at 440 nm and emission from the 560 and 570 nm phosphors through the spectrum from 400 nm to 700 nm. The LED emission spectrum 42 shows peak emission at 440 nm with a relatively narrow emission width. The first 560 nm phosphor emission spectrum 44 results from the phosphor absorbing blue light at 440 nm and re-emitting light as shown with its peak intensity being 0.287 at 560 nm as referenced in the table of FIG. 3c. The second 570 nm phosphor emission spectrum 46 is shown with its peak intensity being 0.301 at 570 nm, as also referenced in the table of FIG. 3c. The first and second emission spectra are broad compared to the LED emission spectra, and the overall emission spectrum 48 is shown with a peak emission at 440 nm from the LED and the combined peak from the broader first and second phosphor emission.

Figure 3E:
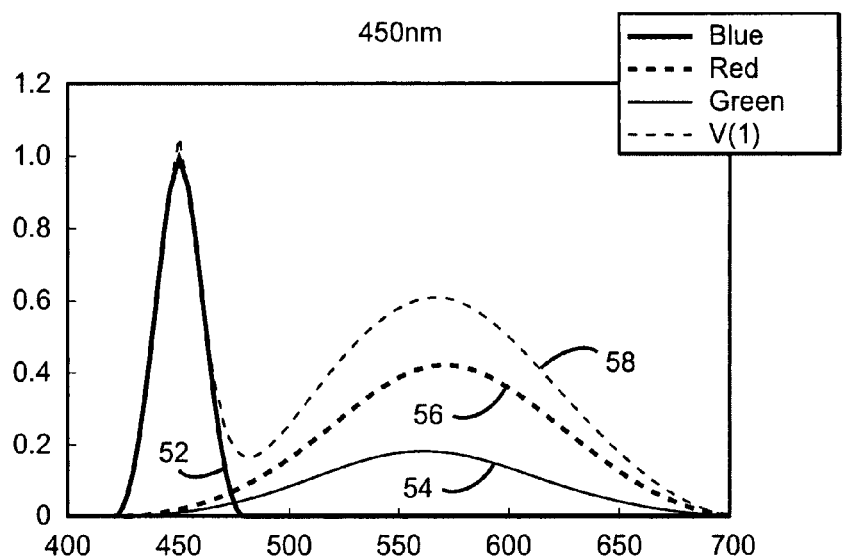

FIG. 3e is a graph showing emission intensities from an LED emitting at 450 nm with emission from the 560 and 570 nm phosphors absorbing and re-emitting light from the LED. The graph includes an emission spectrum from 400 nm to 700 nm. The LED emission spectrum 52 shows peak emission at 450 nm with relatively narrow emission. The 560 and 570 nm phosphor emission spectra 54, 56 from the phosphors absorbing and re-emitting light show broader emission characteristics with the peak at 560 nm and 570 nm corresponding to those from the table in FIG. 3c. The emission intensity from the 570 nm phosphor is increased compared to the emission characteristics for the 440 nm LED shown in FIG. 3d, and the emission intensity for the 560 nm phosphor is decreased. The overall emission spectrum 58 shows a 450 nm peak from the LED and a broad peak from the combined phosphor emissions. This provides overall emission at a CCT of 5850 K.

Figure 3F:
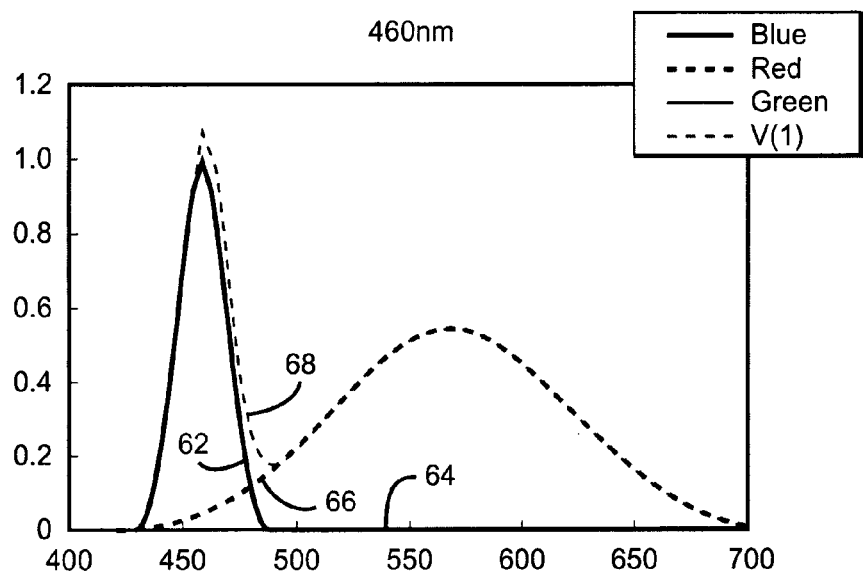

FIG. 3f is a graph showing emission intensities from an LED emitting at 460 nm and emission from the 560 and 570 nm phosphors through the spectrum from 400 nm to 700 nm. The LED emission spectrum 62 shows peak emission at 460 nm with relatively narrow emission. The 560 nm phosphor emission spectrum 64 is flat which is reflected in the zero emission intensity reported in the table of FIG. 3c for the 560 nm emission intensity an 460 nm emission. The second phosphor emission 66 is increased from that in FIG. 3e, with the overall emission spectrum 68 showing the peak from the 460 nm emitter and the phosphor peak corresponding essentially entirely to the peak from the second phosphor emission spectrum.

Figure 3G:
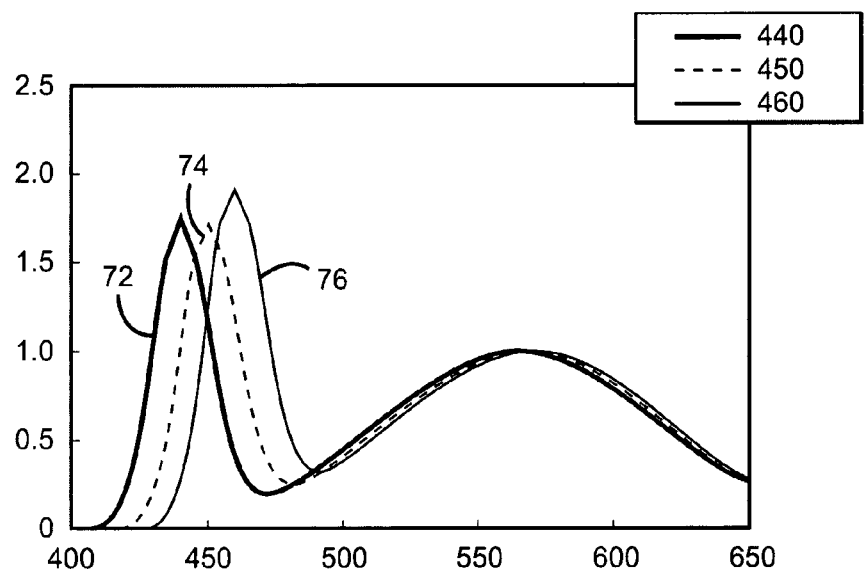
FIG. 3g is a graph showing the combined emission spectra for the packages shown in FIGS. 3d, 3e and 3f.

FIG. 3g shows the three overall emission spectra from the three LED packages including the 440 nm emitting LED package 72, 450 nm emitting package 74 and the 460 nm emitting package 76. Each has a different peak corresponding to the wavelength of its LED with each also having a peak from its phosphors. Each phosphor peak varies slightly such that when combined with its LED emission provides an emission with a CCT of approximately 5850 K.

Figures 4A, 4B:
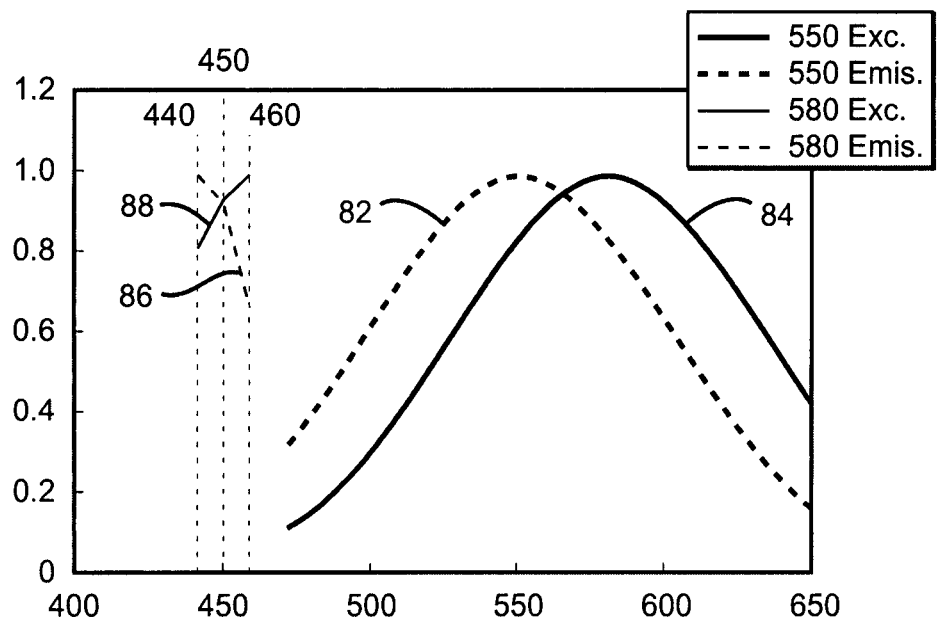
FIG. 4a is a graph showing relative excitation and emission spectra for another embodiment of a two phosphor blend according to the present invention.
FIG. 4b is a table showing the phosphor emission characteristics for packages using the phosphor blend in FIG. 4a and having emitters at three different emission wavelengths.

Different phosphors having different peak re-emission wavelengths and different emission characteristics can be used according to the present invention with emitters emitting from 440 to 460 nm with packages emitting light at a desired color point. FIGS. 4a through 4f show the characteristics for phosphors having peak emission at 550 nm and 580 nm, with the target color point for the LED packages utilizing the phosphors again being 5850 K. The peak emissions for the phosphors are further apart than the 560 and 570 nm phosphors described above and shown in FIGS. 3a through 3e. The excitation and emission of the 550 and 580 nm phosphors need not vary as much through the LED emission ranges compared to the 560 and 570 nm phosphors described above. This is illustrated in FIG. 4a which shows the emission spectra 82, 84 of the 550 and 580 nm phosphors and the corresponding relative excitation spectra 86, 88 from 440 to 460 nm. As can be seen from the relative excitation plots, the excitation of the lower wavelength 550 nm phosphor did not drop as far as the excitation of the lower wavelength 560 nm phosphor as shown in FIG. 3a and discussed above. The higher wavelength 580 nm phosphor does not rise as quickly and through as much of a range as the 570 nm phosphor also shown in FIG. 3a.

FIG. 4b is a table showing the relative emission intensities for blue LEDs emitting at 440, 450 and 460 nm and the corresponding emission intensities for the 550 and 580 nm phosphors. For the three LED emissions of 440, 450 and 460 nm, the ccx and ccy values correspond to CCTs of between 5843K and 5850K. This variation is acceptable as it corresponds to a standard deviation of significantly less than a 4-Step MacAdam ellipse 31 illustrated in FIG. 3b.

Figure 4C:
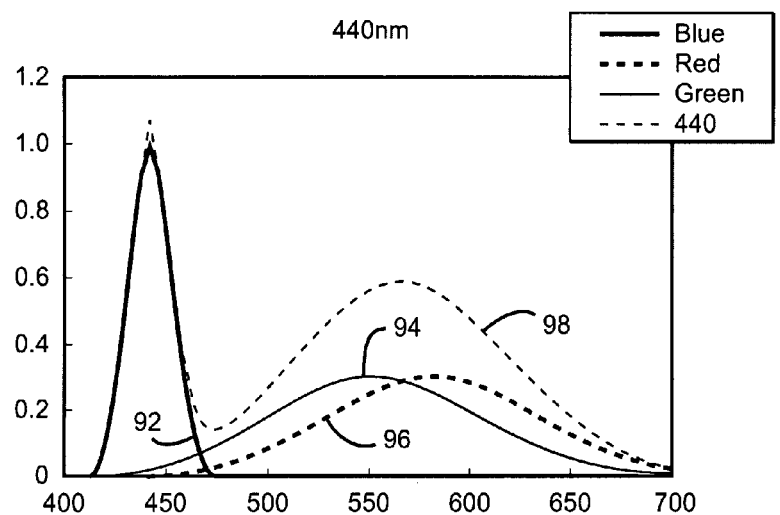
Figure 4D:
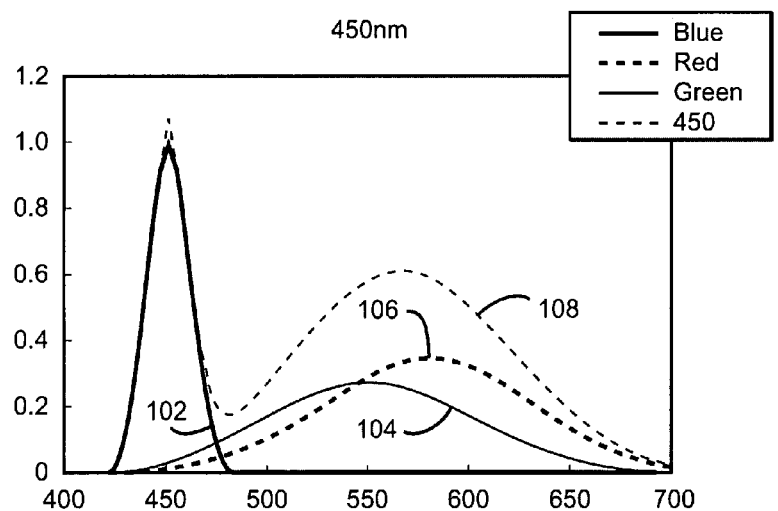
Figure 4E:
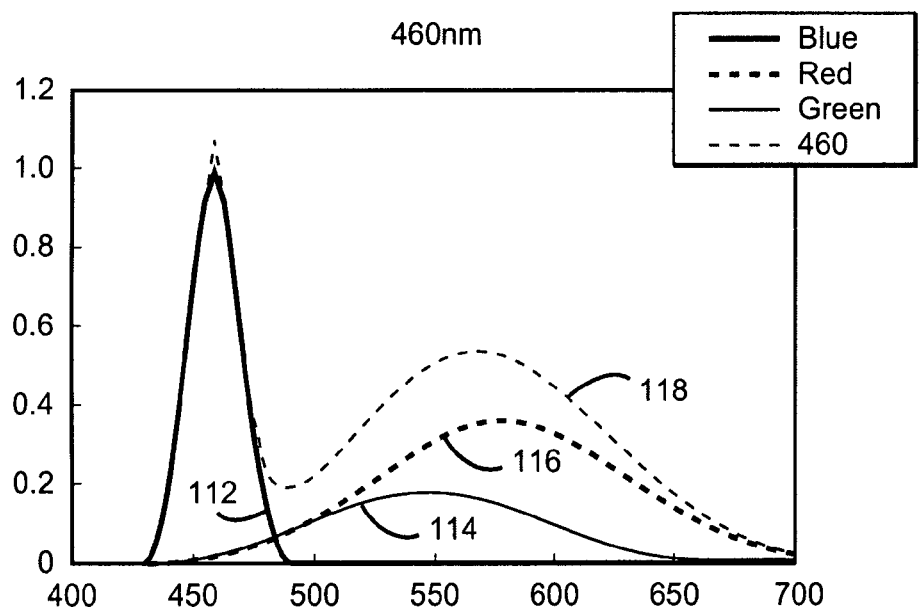
Figure 4F:
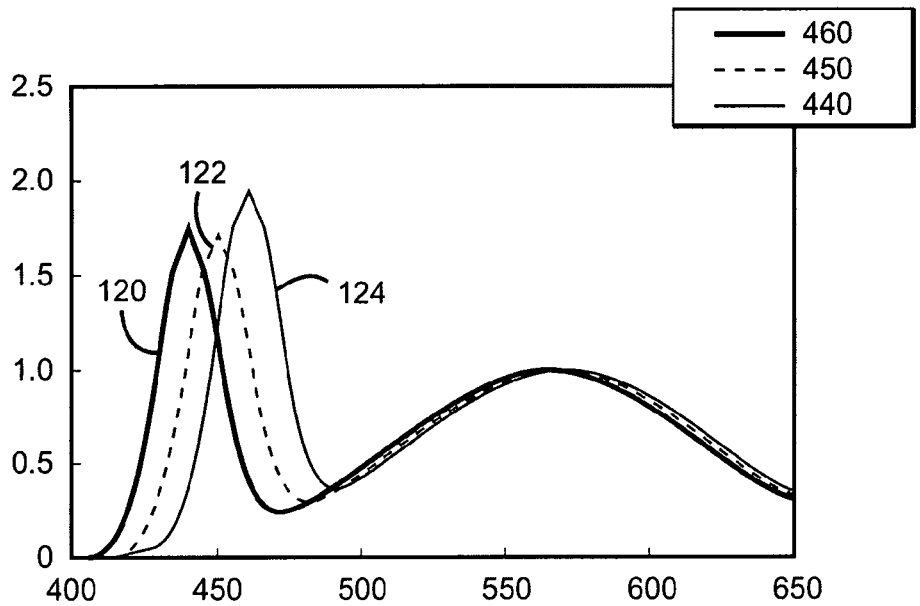
FIG. 4f is a graph showing the combined emission spectra for the packages shown in FIGS. 4c, 4d and 4e.

FIGS. 4c through 4f show the different emission spectra for the 550 and 580 nm phosphors. FIG. 4c shows LED emission spectrum 92 having a peak emission at 440 nm relatively narrow emission spectrum. The 550 nm emission spectrum 94 and 560 emission spectrum 96 are relatively broad with peaks corresponding to peaks at 550 nm and 580 nm. The LED and phosphor emission spectra combine to provide the overall emission spectra 98 that provides the 5850 K CCT. FIG. 4d shows the 450 nm LED emission spectra 102 and the 550 nm and 560 nm emission spectra 104, 106. The overall emission spectrum 108 again has a corresponding 5850 K CCT. Similarly, FIG. 4e shows the 460 nm LED emission spectrum 112, the 550 nm phosphor emission spectrum 114 and the 580 nm phosphor emission spectrum 116, all of which combine to provide the overall emission spectrum 118 that provides the 5843 K CCT. FIG. 4f shows three overall emission spectra 120, 122, 124 for the 440, 450 and 460 emission spectra from the FIGS. 4d, 4e and 4f, showing the different peaks for the different LED wavelengths as well as slightly varying phosphor emissions thus maintaining the CCT within less than a 4-Step MacAdam ellipse.

Figures 5A, 5B:
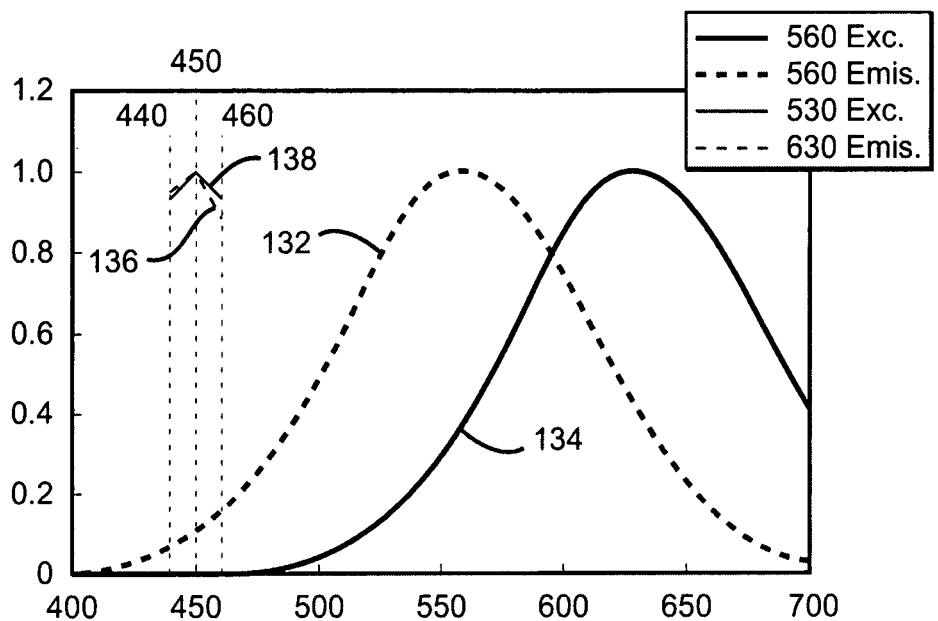
FIG. 5a is graph showing relative excitation and emission spectra for another embodiment of a two phosphor blend according to the present invention.
FIG. 5b is a table showing the phosphor emission characteristics for packages using the phosphor blend in FIG. 5a and having emitters at three different emission wavelengths.

FIGS. 5a and 5b show the emission characteristics for phosphors having peak emission at 560 and 630 nm, and providing a target CCT of 2800 K for LEDs emitting in the range of 440 to 460. This CCT provides a "warmer" emission characteristic and in this embodiment the wavelengths of the phosphors is even further apart than the previous embodiments. Due to the different emission wavelengths and white color target the excitation changes for this embodiment can vary to a even lesser degree compared to previous embodiments.

FIG. 5a shows the emission spectra 132, 134 of the 560 and 630 nm phosphors and the corresponding relative excitation spectra 136, 138 for these phosphors from 440 to 460 nm. As can be seen from the relative excitation spectra, the excitation of the lower wavelength 560 nm phosphor does not drop as steep as the excitation in the previous embodiments. The shape of the 560 nm excitation spectrum 136 shows that the excitation does not need to drop through emission in the 440-460 nm range, but in this case it increases from 440-450 nm and then drops from 450-460 nm. The same is true for the 630 nm excitation spectrum 138. However, the excitation drop for the 630 nm emission is less than for the 560 nm emission. FIG. 5b is a table showing the emission intensities of the 560 and 630 nm phosphors for LEDs emitting at 440, 450 and 460 nm wavelengths. The resulting ccx and ccy values provide CCT of 2800 for each.

By using these phosphor emissions with a defined shape of the excitation spectra LED package emissions, and in particular white emissions, having an approximate constant color point can be achieved using emitters having excitation wavelengths that vary through a certain range. The color point can be maintained independent of the excitation wavelength. As shown above, by using two phosphors having emission peaks further apart, the required difference in excitation slope becomes smaller.

Different phosphors matching the shapes of the excitation spectra are commercially available or can be engineered by phosphor suppliers using known techniques. One example of two phosphors that can be used in a package according to the present invention comprise commercially available $(Ba_{1-x-y}Sr_xCa_ySiO_4:Eu$ phosphors with emission wavelengths at about 520 nm and 585 nm for the first and second phosphor, respectively. The relative excitation spectra for these phosphors approximate those described above in the example of FIGS. 4a and 4b.

As described above, the principle of using phosphors with specific emission and excitation characteristics to achieve tight color distributions applies to a wide variety of LED packages with different LED emissions and target colors, including but not limited to cool and warm white LED packages. The same principle of "designed" excitation characteristics can also be applied to color LED packages using down-conversion materials. For instance green or red emitting LED packages with tight color control emissions can be fabricated by utilizing two or more component phosphor blends with specific emission wavelengths around the respective LED package color target and correspondingly tailored excitation properties. Similarly, the primary LED emission with particular wavelength variations can be in the UV, blue or even in other spectral ranges.

Although the present invention has been described in detail with reference to certain preferred configurations thereof, other versions are possible. Therefore, the spirit and scope of the invention should not be limited to the versions described above.

We claim:

1. An emitter package, comprising:
a plurality of light emitting diodes (LED) emitting light within a wavelength range, wherein said wavelength range width is at least 10 nm and up to 50 nm;
a plurality of phosphors, said plurality of phosphors comprising at least two different phosphors, said at least two different phosphors having emission wavelengths and excitation characteristics such that a first of said phosphors has an increased excitation efficiency at longer wavelengths, within said wavelength range, compared to a second of said phosphors having a decreased excitation efficiency at the same longer wavelengths, each of which absorbs at least some light from said LED and re-emits a different wavelength of light, wherein the same plurality of phosphors is over at least two of said LEDs; and
wherein said emitter package emits a combination of light from said LED and said plurality of phosphors, in which said package emission is within a 4-step MacAdam ellipse around a target color, regardless of variations in the wavelength emitted, within said wavelength range, from said LED.

2. The emitter package of claim 1, wherein said emitter package emitting a white light combination of light from said LED and said phosphors.

3. The emitter package of claim 1, wherein said plurality of phosphors comprises two phosphors.

4. The emitter package of claim 1, wherein said range of emission wavelengths is approximately 430 to 480 nm and said plurality of phosphors comprises first and second phosphors having peak emissions at approximately 560 and approximately 570 nm, respectively.

5. The emitter package of claim 4, having a white color target approximately on the black body locus (BBL) of a CIE color coordinate system.

6. The emitter package of claim 1, wherein said wavelength range is 430 to 480 nm and said plurality of phosphors comprises first and second phosphors having peak emissions at 500 to 560 nm and 570 to 630 nm, respectively.

7. The emitter package of claim 6, wherein said target color temperature falls within the white range on the black body locus (BBL) of a CIE color coordinate system.

8. The emitter package of claim 1, wherein said range of emission wavelengths is approximately 430 to 480 nm and said first and second phosphors having peak emission at approximately 500 to 560 nm and 570 to 630 nm, respectively.

9. The emitter package of claim 8, having a white color target approximately on the black body locus (BBL) of a CIE color coordinate system.

10. The emitter package of claim 8, having a cool white color target with a correlated color temperature (CCT) between about 5,000K and about 10,000K approximately on the black body locus (BBL) of a CIE color coordinate system.

11. The emitter package of claim 8, having a warm white color target with a correlated color temperature (CCT) between about 2,000K and about 5,000K approximately on the black body locus (BBL) of a CIE color coordinate system.

12. The emitter package of claim 1, wherein said plurality of phosphors comprise two phosphors of the general composition $(Ba_{1-x-y}Sr_xCa_y)SiO_4$:Eu with emission wavelengths at approximately 520 nm and 585 nm, respectively.

13. The emitter package of claim 1, wherein said emitter package emits light within a 2-step MacAdam ellipse of said target color.

14. The emitter package of claim 1, wherein said emitter package emits light within a 3-step MacAdam ellipse of said target color.

15. The emitter package of claim 1, wherein said plurality of phosphors comprises first and second phosphors, said first phosphor re-emitting light with greater intensity when said LED emits at lower wavelengths, and said second phosphor re-emitting light with greater intensity when said LED emits at higher wavelengths.

16. The emitter package of claim 1, comprising first and second LEDs emitting light within said wavelength range.

17. The emitter package of claim 16, wherein said first and second LEDs emit different wavelengths of light.

18. The emitter package of claim 16, wherein said emitter package is configured to emit light with a color temperature substantially similar to said nominal color temperature when each of said first and second LEDs emits at any wavelength within said wavelength range.

19. An emitter package, comprising:
at least three light emitting diodes (LED) emitting light within a wavelength range, wherein said wavelength range width is at least 10 nm and up to 50 nm;
a plurality of phosphors, said plurality of phosphors comprising at least two different phosphors, said at least two different phosphors having emission wavelengths and excitation characteristics such that a first of said phosphors has an increased excitation efficiency at longer wavelengths, within said wavelength range, compared to a second of said phosphors having a decreased excitation efficiency at the same longer wavelengths, each of which absorbs at least some light from said LED and re-emits a different wavelength of light, wherein the same plurality of phosphors is over at least three of said LEDs; and
wherein said emitter package emits a combination of light from said LED and said plurality of phosphors, in which said package emission is within a 4-step MacAdam ellipse around a target color, regardless of variations in the wavelength emitted, within said wavelength range, from said LED.

20. The emitter package of claim 19, wherein said plurality of phosphors is disposed contiguously over said at least three LEDs.

* * * * *